(12) United States Patent
Koo et al.

(10) Patent No.: US 9,224,647 B2
(45) Date of Patent: Dec. 29, 2015

(54) SEMICONDUCTOR DEVICE AND METHOD OF FORMING TSV INTERPOSER WITH SEMICONDUCTOR DIE AND BUILD-UP INTERCONNECT STRUCTURE ON OPPOSING SURFACES OF THE INTERPOSER

(75) Inventors: Jun Mo Koo, Singapore (SG); Pandi Chelvam Marimuthu, Singapore (SG); Jae Hun Ku, Singapore (SG); Seung Wook Yoon, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/184,253

(22) Filed: Jul. 15, 2011

(65) Prior Publication Data
US 2012/0074585 A1 Mar. 29, 2012

Related U.S. Application Data

(60) Provisional application No. 61/386,423, filed on Sep. 24, 2010.

(51) Int. Cl.
*H01L 23/48* (2006.01)
*H01L 21/56* (2006.01)
(Continued)

(52) U.S. Cl.
CPC ........ *H01L 21/76898* (2013.01); *H01L 21/486* (2013.01); *H01L 21/561* (2013.01); *H01L 21/568* (2013.01); *H01L 23/147* (2013.01); *H01L 23/49827* (2013.01); *H01L 23/49833* (2013.01); *H01L 25/0652* (2013.01); *H01L 25/0655* (2013.01); *H01L 25/0657* (2013.01);
(Continued)

(58) Field of Classification Search
CPC .................. H01L 2225/06541; H01L 21/486; H01L 21/76898; H01L 23/481; H01L 23/49827; H01L 23/5384; H01L 25/043; H01L 25/0657; H01L 25/117; H01L 23/28
USPC ................... 257/E21.499, E21.502, E21.511; 438/106, 107, 109, 125, 126, 667, 977
See application file for complete search history.

(56) References Cited

U.S. PATENT DOCUMENTS 6,107,164 A    8/2000 Ohuchi
6,322,903 B1 *  11/2001 Siniaguine et al. ........... 428/617
(Continued)

FOREIGN PATENT DOCUMENTS

TW    201015687 A    4/2010
TW    201017847 A    5/2010

*Primary Examiner* — Peniel M Gumedzoe
(74) *Attorney, Agent, or Firm* — Robert D. Atkins; Patent Law Group: Atkins and Associates, P.C.

(57) ABSTRACT

A semiconductor device has a substrate with first and second opposing surfaces. A plurality of conductive vias is formed partially through the first surface of the substrate. A first conductive layer is formed over the first surface of the substrate electrically connected to the conductive vias. A first semiconductor die is mounted over the first surface of the substrate. The first semiconductor die and substrate are mounted to a carrier. An encapsulant is deposited over the first semiconductor die, substrate, and carrier. A portion of the second surface of the substrate is removed to expose the conductive vias. An interconnect structure is formed over a surface of the substrate opposite the first semiconductor die. A second semiconductor die can be stacked over the first semiconductor die. A second semiconductor die can be mounted over the first surface of the substrate adjacent to the first semiconductor die.

14 Claims, 13 Drawing Sheets

(51) Int. Cl.
*H01L 21/768* (2006.01)
*H01L 21/48* (2006.01)
*H01L 23/14* (2006.01)
*H01L 25/065* (2006.01)
*H01L 25/10* (2006.01)
*H01L 25/00* (2006.01)
*H01L 23/31* (2006.01)
*H01L 23/498* (2006.01)
*H01L 23/00* (2006.01)
*H01L 25/18* (2006.01)

(52) U.S. Cl.
CPC ............ *H01L 25/105* (2013.01); *H01L 25/50* (2013.01); *H01L 23/3128* (2013.01); *H01L 23/49816* (2013.01); *H01L 24/05* (2013.01); *H01L 24/06* (2013.01); *H01L 24/13* (2013.01); *H01L 24/16* (2013.01); *H01L 24/73* (2013.01); *H01L 24/81* (2013.01); *H01L 24/92* (2013.01); *H01L 24/97* (2013.01); *H01L 25/18* (2013.01); *H01L 2224/0345* (2013.01); *H01L 2224/03452* (2013.01); *H01L 2224/03464* (2013.01); *H01L 2224/0401* (2013.01); *H01L 2224/05009* (2013.01); *H01L 2224/0557* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/06181* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16146* (2013.01); *H01L 2224/16225* (2013.01); *H01L 2224/16227* (2013.01); *H01L 2224/16235* (2013.01); *H01L 2224/32225* (2013.01); *H01L 2224/48091* (2013.01); *H01L 2224/73204* (2013.01); *H01L 2224/73265* (2013.01); *H01L 2224/81192* (2013.01); *H01L 2224/81201* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81815* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06548* (2013.01); *H01L 2225/1023* (2013.01); *H01L 2225/1058* (2013.01); *H01L 2924/00014* (2013.01); *H01L 2924/01322* (2013.01); *H01L 2924/12041* (2013.01); *H01L 2924/13091* (2013.01); *H01L 2924/1431* (2013.01); *H01L 2924/1433* (2013.01); *H01L 2924/1434* (2013.01); *H01L 2924/14335* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01); *H01L 2924/3511* (2013.01)

(56) References Cited

U.S. PATENT DOCUMENTS

| | | | |
|---|---|---|---|
| 6,534,387 B1 | 3/2003 | Shinogi et al. | |
| 6,649,445 B1 | 11/2003 | Qi et al. | |
| 7,064,005 B2 * | 6/2006 | Takaoka | 438/108 |
| 7,221,059 B2 | 5/2007 | Farnworth et al. | |
| 7,553,752 B2 | 6/2009 | Kuan et al. | |
| 7,741,148 B1 | 6/2010 | Marimuthu et al. | |
| 7,880,293 B2 | 2/2011 | Han et al. | |
| 2003/0092256 A1 * | 5/2003 | Mashino | 438/630 |
| 2005/0186705 A1 | 8/2005 | Jackson et al. | |
| 2005/0189639 A1 | 9/2005 | Tanie et al. | |
| 2008/0014742 A1 * | 1/2008 | Kato | 438/627 |
| 2008/0315372 A1 * | 12/2008 | Kuan et al. | 257/659 |
| 2008/0315375 A1 | 12/2008 | Eichelberger et al. | |
| 2008/0316714 A1 * | 12/2008 | Eichelberger et al. | 361/728 |
| 2009/0045487 A1 * | 2/2009 | Jung | 257/621 |
| 2009/0212420 A1 | 8/2009 | Hedler et al. | |
| 2009/0302435 A1 | 12/2009 | Pagaila et al. | |
| 2010/0059855 A1 * | 3/2010 | Lin et al. | 257/528 |
| 2010/0065942 A1 * | 3/2010 | Lin et al. | 257/531 |
| 2010/0072600 A1 | 3/2010 | Gerber | |
| 2010/0078771 A1 * | 4/2010 | Barth et al. | 257/621 |
| 2010/0078789 A1 | 4/2010 | Choi et al. | |
| 2010/0096760 A1 | 4/2010 | Yu et al. | |
| 2010/0140771 A1 | 6/2010 | Huang et al. | |
| 2010/0140772 A1 | 6/2010 | Lin et al. | |
| 2010/0144094 A1 * | 6/2010 | Chen et al. | 438/109 |
| 2010/0308443 A1 | 12/2010 | Suthiwongsunthorn et al. | |
| 2011/0156233 A1 | 6/2011 | Kim | |
| 2011/0285014 A1 | 11/2011 | Shen et al. | |

* cited by examiner

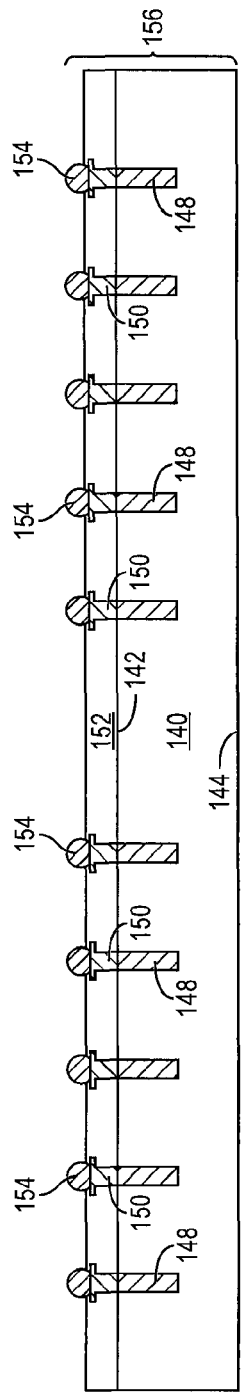
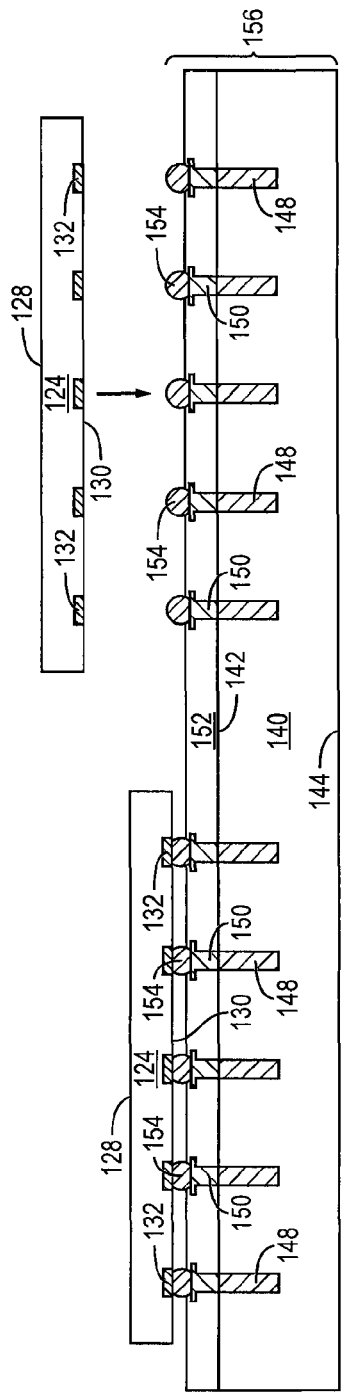
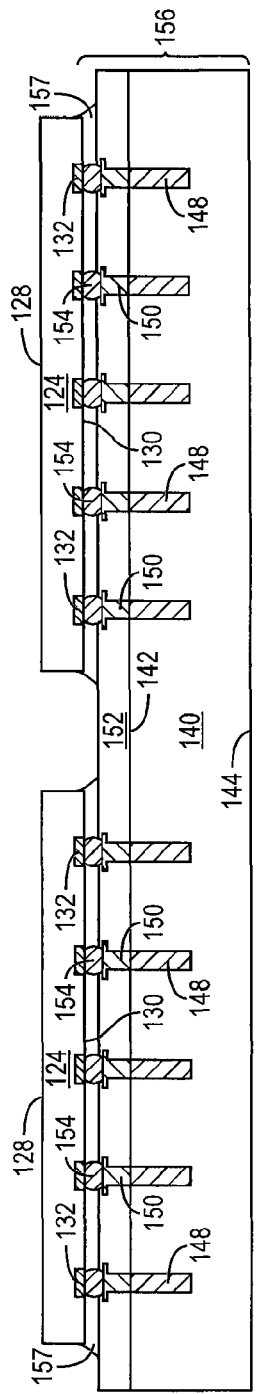
FIG. 4e
FIG. 4f
FIG. 4g

SEMICONDUCTOR DEVICE AND METHOD OF FORMING TSV INTERPOSER WITH SEMICONDUCTOR DIE AND BUILD-UP INTERCONNECT STRUCTURE ON OPPOSING SURFACES OF THE INTERPOSER

CLAIM TO DOMESTIC PRIORITY

The present application claims priority to Provisional Application No. 61/386,423, filed Sep. 24, 2010, and claims priority to the above applications pursuant to 35 U.S.C. §120.

FIELD OF THE INVENTION

The present invention relates in general to semiconductor devices and, more particularly, to a semiconductor device and method of forming a TSV interposer with a semiconductor die and build-up interconnect structure on opposing surfaces of the interposer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a fan-out wafer level chip scale package (Fo-WLCSP), a semiconductor die is typically enclosed by an encapsulant. A bottom build-up interconnect structure is formed over the semiconductor die and encapsulant for electrical interconnect. The semiconductor die, encapsulant, and build-up interconnect structure typically each have a different coefficient of thermal expansion (CTE). The different CTE between the semiconductor die, encapsulant, and build-up interconnect structure induce thermal stress and cause warpage during and after encapsulation. In addition, the electrical interconnect between the semiconductor die and build-up interconnect structure restricts the interconnect pitch and reduces input/output (I/O) count.

SUMMARY OF THE INVENTION

A need exists to reduce thermal stress between the semiconductor die, encapsulant, and build-up interconnect structure, as well as reduce interconnect pitch and increase I/O count. Accordingly, in one embodiment, the present invention is a method of making a semiconductor device comprising the steps of providing a substrate having first and second opposing surfaces, forming a plurality of conductive vias partially through the first surface of the substrate, forming a first conductive layer over the first surface of the substrate electrically connected to the conductive vias, mounting a first semiconductor die over the first surface of the substrate electrically connected to the first conductive layer, providing a carrier, mounting the first semiconductor die and substrate to the carrier, depositing an encapsulant over the first semiconductor die, substrate, and carrier, removing a portion of the second surface of the substrate to expose the conductive vias, and forming an interconnect structure over a surface of the substrate opposite the first semiconductor die.

In another embodiment, the present invention is a method of making a semiconductor device comprising the steps of providing a substrate having first and second opposing surfaces, forming a plurality of conductive vias within the substrate, mounting a first semiconductor die over the first surface of the substrate, providing a carrier, mounting the first semiconductor die and substrate to the carrier, depositing an encapsulant over the first semiconductor die, substrate, and carrier, and forming an interconnect structure over the second surface of the substrate opposite the first semiconductor die.

In another embodiment, the present invention is a method of making a semiconductor device comprising the steps of providing a substrate, forming a plurality of conductive vias within the substrate, mounting a first semiconductor die over a first surface of the substrate, depositing an encapsulant over the first semiconductor die and substrate, and forming an interconnect structure over a second surface of the substrate opposite the first semiconductor die.

In another embodiment, the present invention is a semiconductor device comprising a substrate and plurality of conductive vias formed within the substrate. A first semiconductor die is mounted over a first surface of the substrate. An encapsulant is deposited over the first semiconductor die and substrate. An interconnect structure is formed over a second surface of the substrate opposite the first semiconductor die.

DETAILED DESCRIPTION OF THE DRAWINGS

Figure 1:
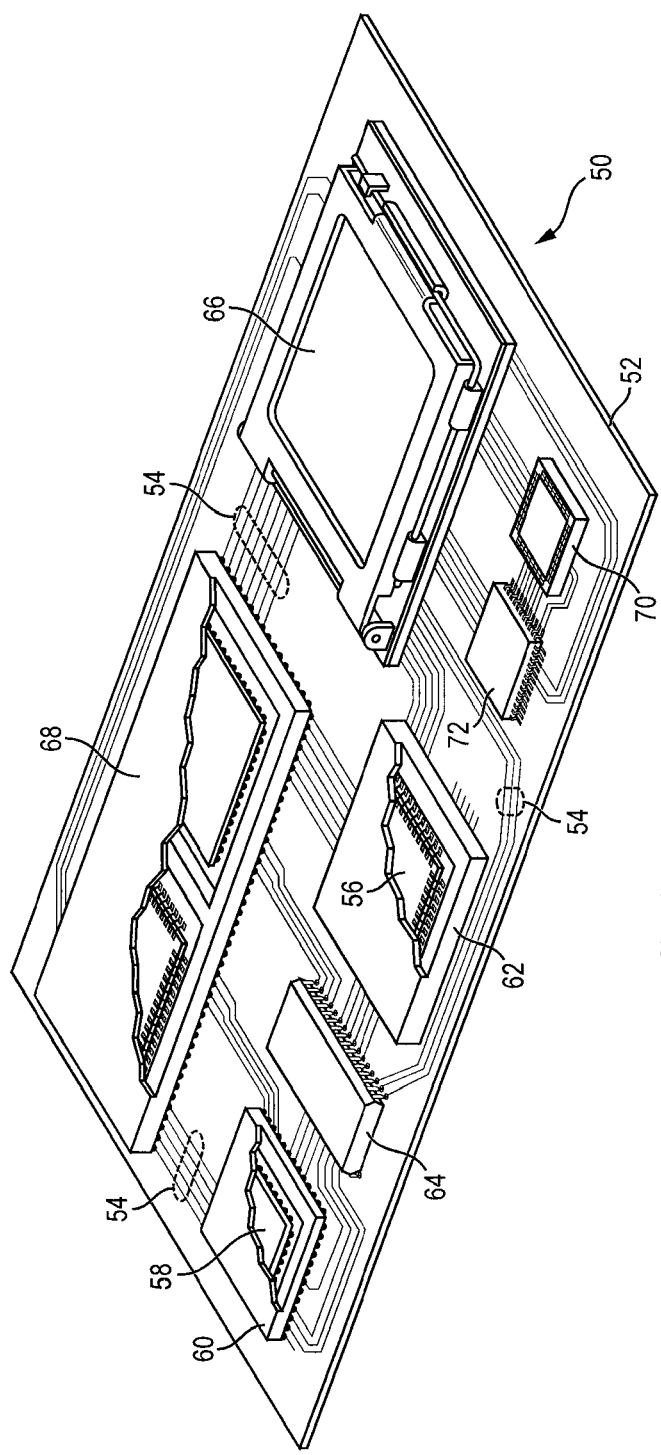
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
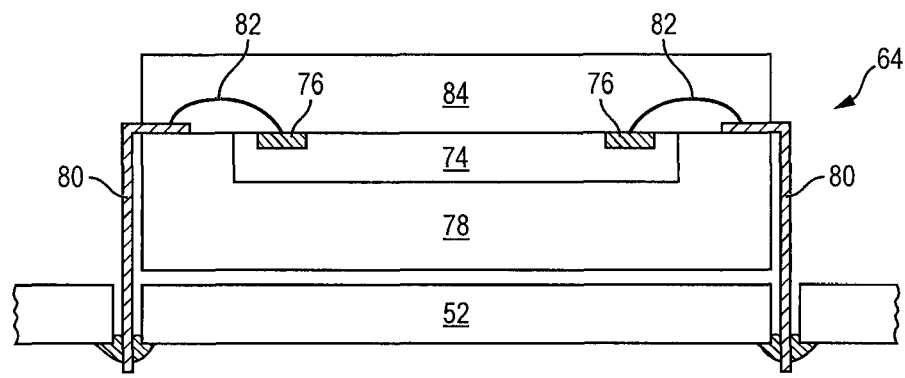
FIGS. 2a-2c illustrate further detail of the representative semiconductor packages mounted to the PCB.
Figure 2B:
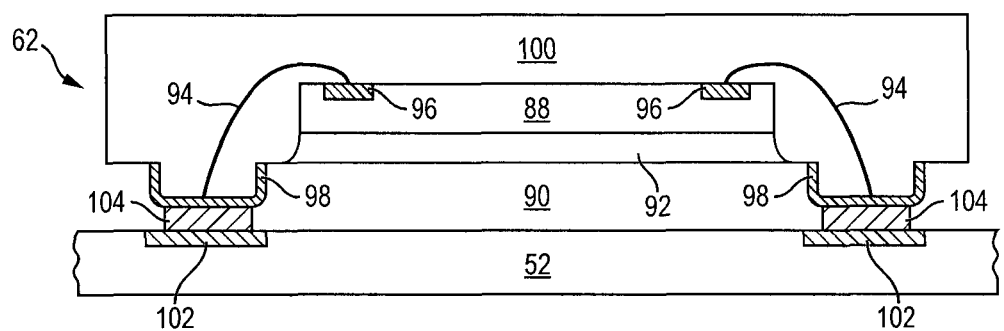
Figure 2C:
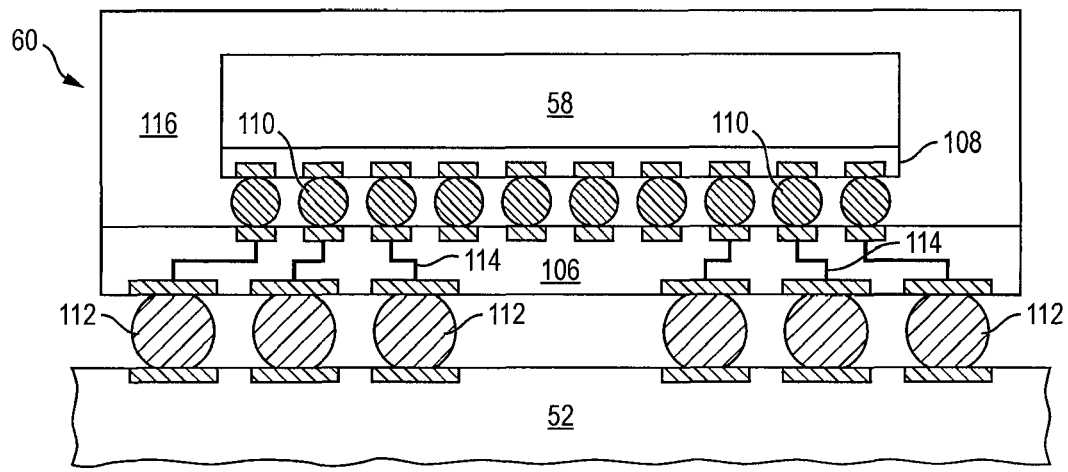

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
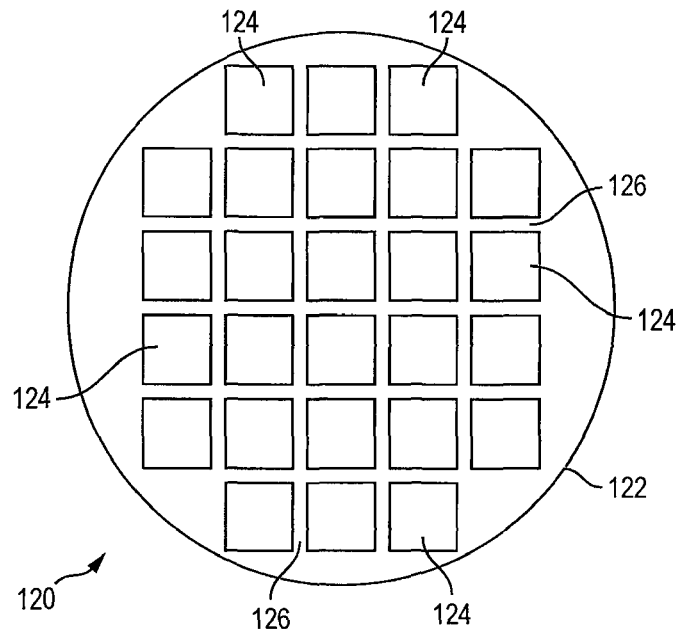
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124.

Figure 3B:
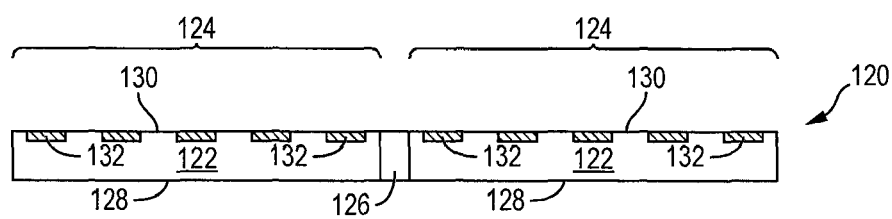

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
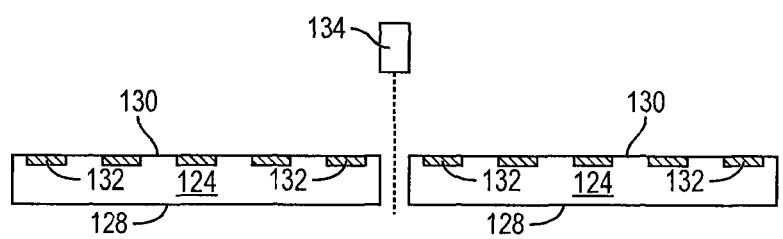

In FIG. 3c, semiconductor wafer 120 is singulated through saw street 126 using a saw blade or laser cutting tool 134 into individual semiconductor die 124.

Figure 4A:
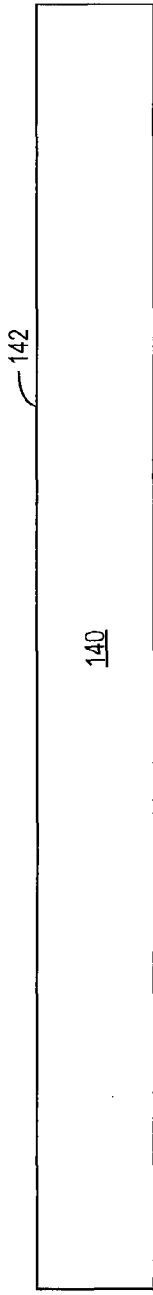
FIGS. 4a-4o illustrate process of forming a TSV interposer with a semiconductor die and build-up interconnect structure on opposing surfaces of the interposer.
Figure 4B:
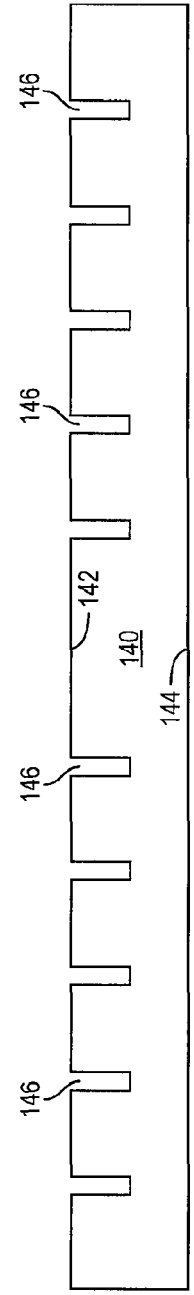
Figure 4C:
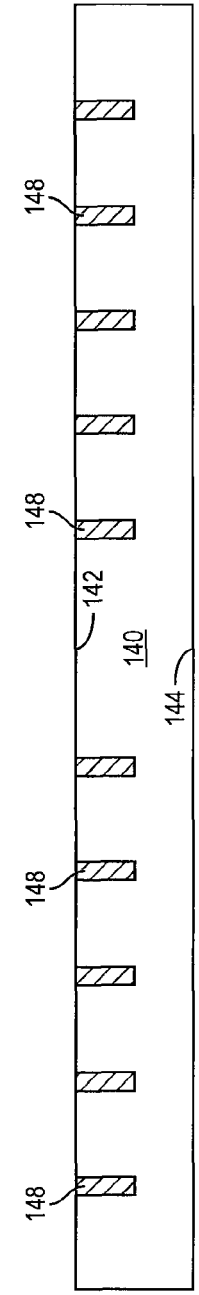
Figure 4D:
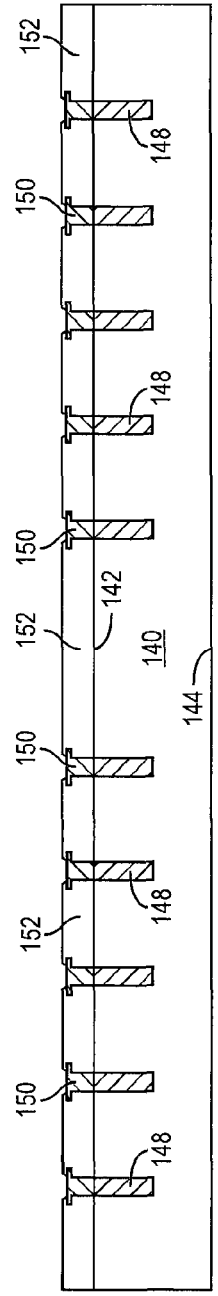
Figure 4H:
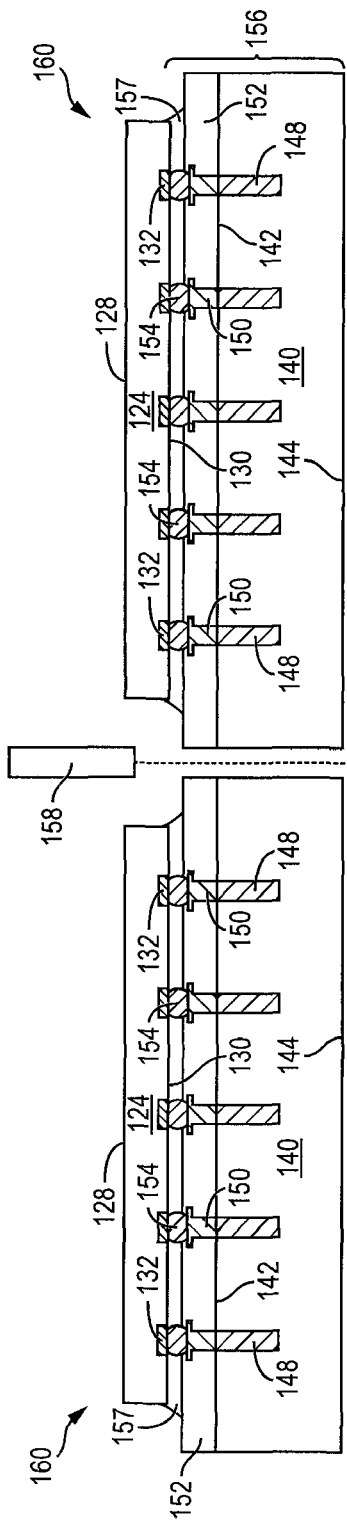
Figure 4I:
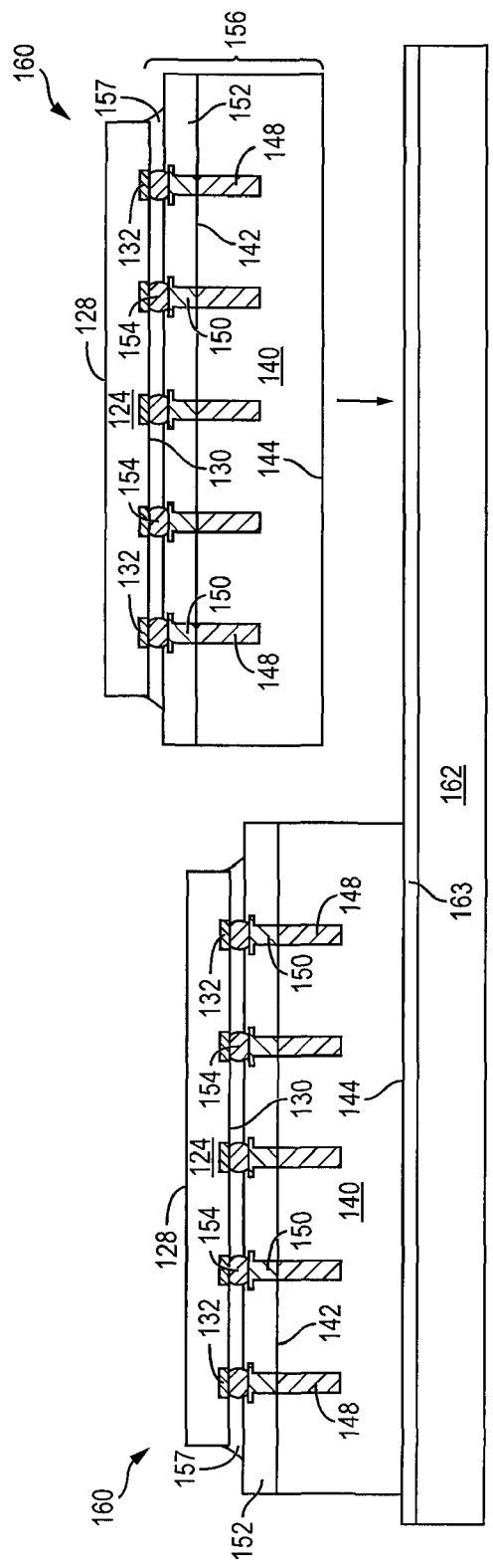
Figure 4J:
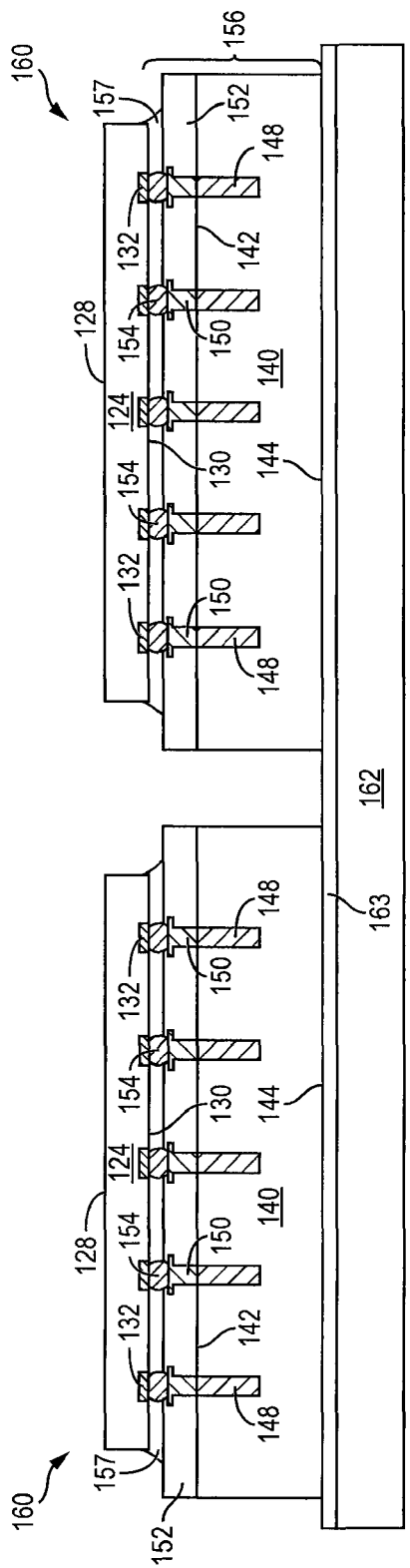
Figure 4K:
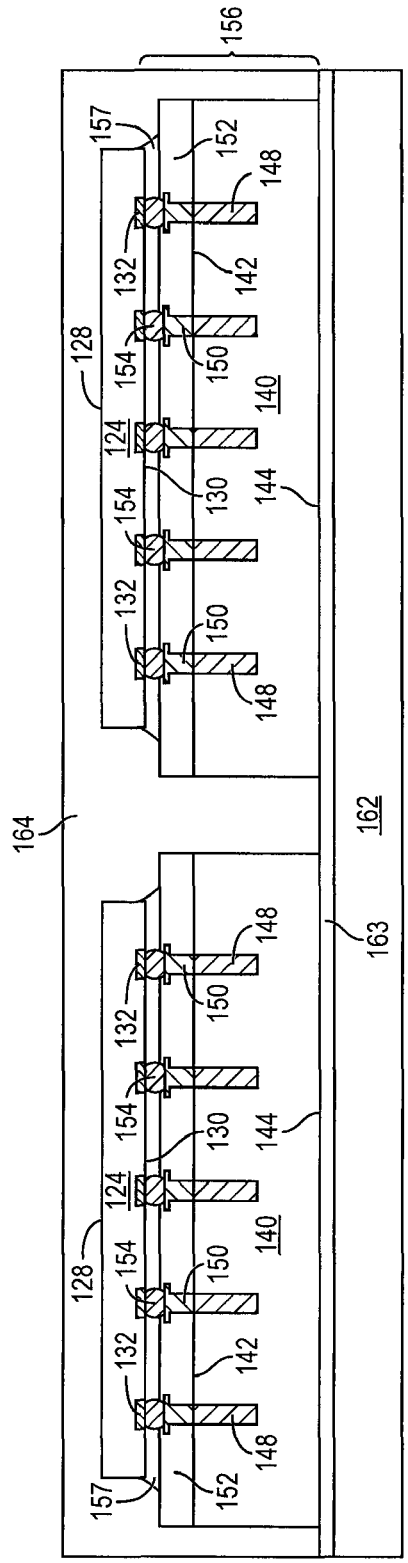
Figure 4L:
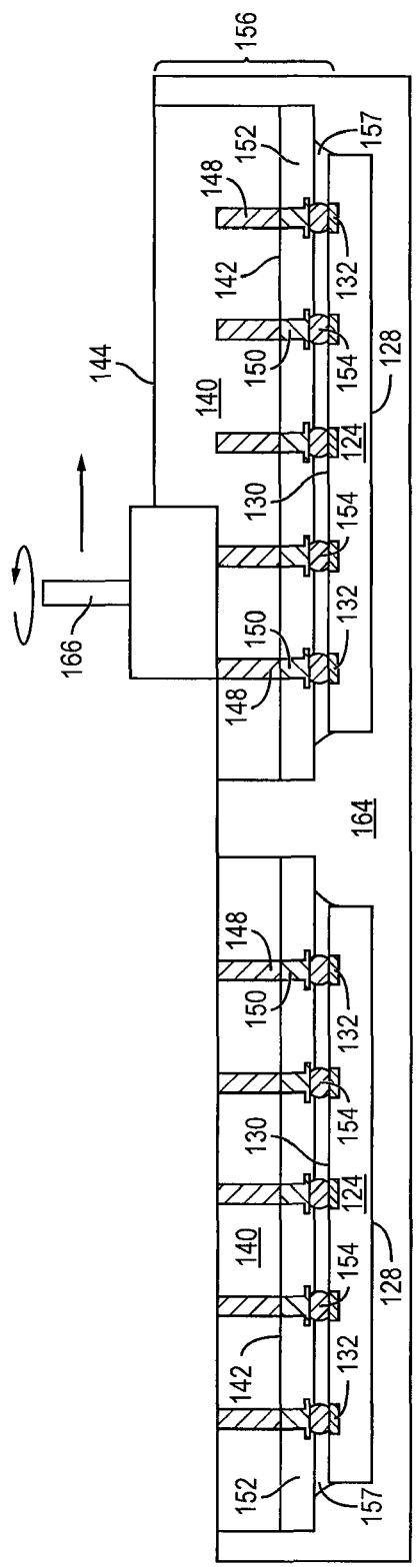
Figure 4M:
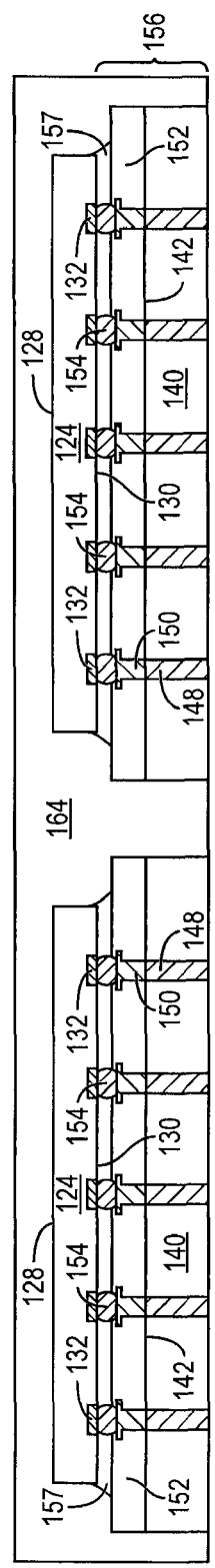
Figure 4N:
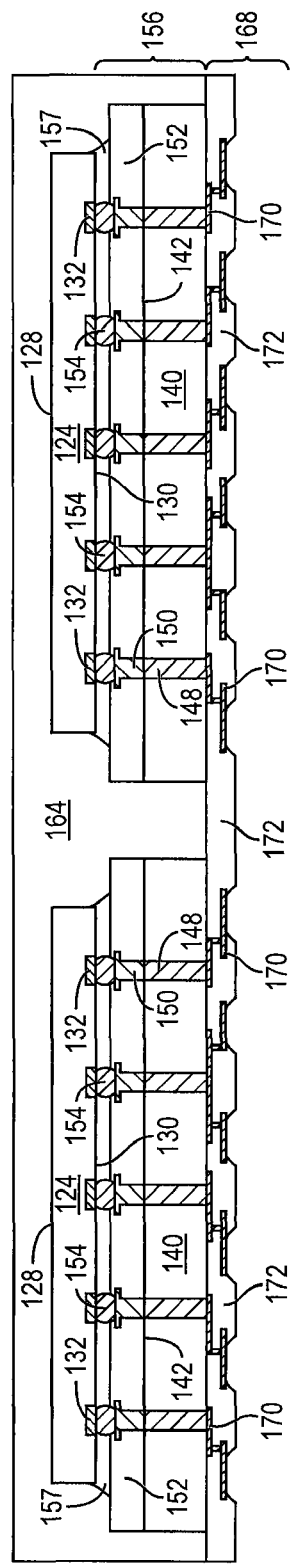
Figure 4O:
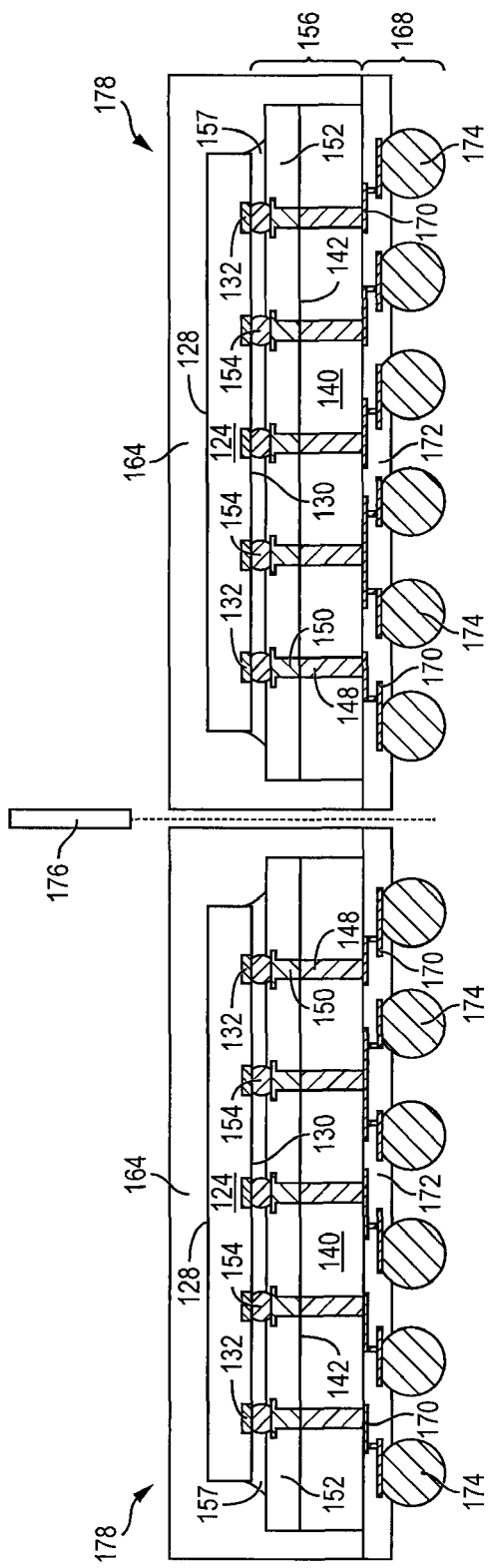

FIGS. 4a-4o illustrate, in relation to FIGS. 1 and 2a-2c, a process of forming a TSV interposer with a semiconductor die and build-up interconnect structure on opposing surfaces of the interposer. FIG. 4a shows a semiconductor wafer or substrate 140 containing a base material, such as silicon, germanium, gallium arsenide, indium phosphide, or silicon carbide, for structural support. Alternatively, substrate 140 can be polymer, beryllium oxide, or other suitable low-cost, rigid material for structural support. Substrate 140 has opposing surfaces 142 and 144.

In FIG. 4b, a plurality of blind vias 146 is formed partially through substrate 140 using mechanical drilling, laser drilling, or deep reactive ion etching (DRIE). Vias 146 extend from surface 142 partially but not completely through substrate 140. In one embodiment, vias 146 are cut through 60% of the thickness of substrate 140. The remaining portion of substrate 140 between vias 146 and back surface 144 provide structural support for the substrate during subsequent manufacturing processes.

In FIG. 4c, vias 146 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive vias 148.

In FIG. 4d, an electrically conductive layer 150 is formed over surface 142 of substrate 140 using PVD, CVD, electrolytic plating, electroless plating process, or other suitable metal deposition process. Conductive layer 150 can be one or more layers of Al, Cu, Sn, Ni, Au, Ag, or other suitable electrically conductive material. Conductive layer 150 operates as contact pads or under bumps metallization (UBM) layer for electrical interconnect. Conductive layer 150 also includes redistribution layers (RDL) and z-direction conductive vias for routing electrical signals horizontally and vertically through substrate 140. One portion of conductive layer 150 is electrically connected to conductive vias 148. Other portions of conductive layer 150 can be electrically common or electrically isolated depending on the design and function of semiconductor die 124.

An insulating or passivation layer 152 is formed over surface 142 of substrate 140 and around conductive layer 150 using PVD, CVD, printing, spin coating, spray coating, sintering or thermal oxidation. The insulating layer 152 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 152 is removed by an etching process through a photoresist layer (not shown) to expose conductive layer 150.

In FIG. 4e, an electrically conductive bump material is deposited over the exposed portion of conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 154. In some applications, bumps 154 are reflowed a second time to improve electrical contact to conductive layer 150. Bumps 154 can also be compression bonded to conductive layer 150. Bumps 154 represent one type of interconnect structure that can be formed over conductive layer 150. The interconnect structure can also use stud bump, micro bump, or other electrical interconnect.

The combination of substrate 140, conductive vias 148, conductive layer 150, insulating layer 152, and bumps 154 constitute through silicon via (TSV) interposer 156.

In FIG. 4f, semiconductor die 124 from FIGS. 3a-3c are mounted to interposer 156 using a pick and place operation with active surface 130 oriented toward the interposer. Bumps 154 are reflowed to electrically connect conductive layer 150 of interposer 156 to conductive layer 132 of semiconductor die 124. FIG. 4g shows semiconductor die 124 metallurgically and electrically connected to interposer 156. An optional underfill material 157 is deposited under semiconductor die 124.

In FIG. 4h, interposer 156 is singulated with saw blade or laser cutting tool 158 into individual die/interposer assemblies 160, each die/interposer assembly including a semiconductor die 124 and portion of interposer 156.

In FIG. 4i, a temporary substrate or carrier 162 contains sacrificial base material such as silicon, polymer, beryllium oxide, or other suitable low-cost, rigid material for structural support. An interface layer or double-sided tape 163 is formed over carrier 162 as a temporary adhesive bonding film or etch-stop layer. The die/interposer assemblies 160 are positioned over and mounted to interface layer 163 and carrier 162 using a pick and place operation with semiconductor die 124 oriented away from the carrier. FIG. 4j shows die/interposer assemblies 160 mounted to interface layer 163 and carrier 162. The die/interposer assemblies 160 mounted to carrier 162 constitute a reconfigured wafer.

In FIG. 4k, an encapsulant or molding compound 164 is wafer-level deposited over and around die/interposer assemblies 160 and carrier 162 using a paste printing, compressive molding, transfer molding, liquid encapsulant molding, vacuum lamination, spin coating, or other suitable applicator. Encapsulant 164 can be polymer composite material, such as epoxy resin with filler, epoxy acrylate with filler, or polymer with proper filler. Encapsulant 164 is non-conductive and environmentally protects the semiconductor device from external elements and contaminants.

In FIG. 4l, a portion of the base material of substrate 140 is removed by grinder 166 to expose conductive vias 148. FIG. 4m shows die/interposer assemblies 160 covered by encapsulant 164 after the grinding operation with conductive vias 148 exposed from substrate 140.

In FIG. 4n, a build-up interconnect structure 168 is formed over a surface of interposer 156 opposite semiconductor die 124. The build-up interconnect structure 168 includes an electrically conductive layer or RDL 170 formed using a patterning and metal deposition process such as sputtering, electrolytic plating, and electroless plating. Conductive layer 170 can be one or more layers of Al, Cu, Sn, Ni, Au, Ag, or other suitable electrically conductive material. Conductive layer 170 includes horizontal and vertical portions for electrical interconnect. One portion of conductive layer 170 is electrically connected to conductive vias 148. Other portions of conductive layer 170 can be electrically common or electrically isolated depending on the design and function of semiconductor die 124.

An insulating or passivation layer 172 is formed around and between conductive layer 170 for electrical isolation using PVD, CVD, printing, spin coating, spray coating, sintering or thermal oxidation. The insulating layer 170 contains one or more layers of SiO2, Si3N4, SiON, Ta2O5, Al2O3, or other material having similar insulating and structural properties. A portion of insulating layer 170 can be removed by an etching process through a photoresist layer to expose conductive layer 170 for bump formation or additional package interconnect. The build-up interconnect structure 168 is electrically connected to conductive layer 150, bumps 154, and semiconductor die 124 by way of conductive vias 148.

In FIG. 4o, an electrically conductive bump material is deposited over build-up interconnect structure 168 and electrically connected to the exposed portion of conductive layer 170 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 170 using a suitable attachment or bonding process. In one embodiment, the bump material is reflowed by heating the material above its melting point to form balls or bumps 174. In some applications, bumps 174 are reflowed a second time to improve electrical contact to conductive layer 170. A UBM layer can be formed under bumps 174. Bumps 174 can also be compression bonded to conductive layer 170. Bumps 174 represent one type of interconnect structure that can be formed over conductive layer 170. The interconnect structure can also use stud bump, micro bump, or other electrical interconnect.

Figure 5:
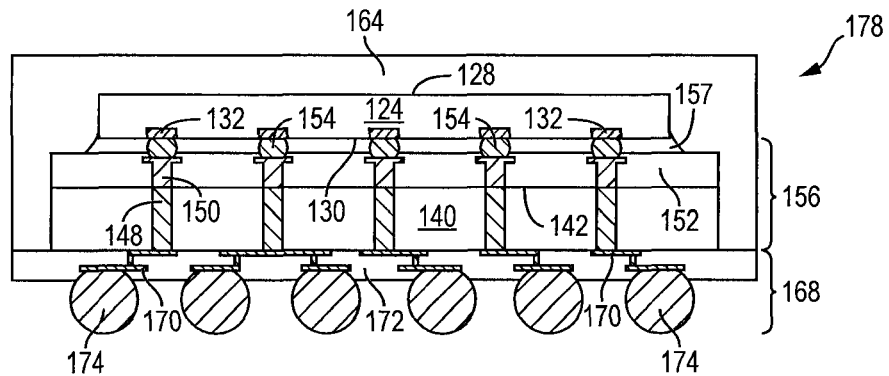
FIG. 5 illustrates an eWLB with the semiconductor die and build-up interconnect structure on opposing surfaces of the TSV interposer.

Semiconductor die 124 are singulated through encapsulant 164 and build-up interconnect structure 168 with saw blade or laser cutting tool 176 into individual Fo-WLCSP or embedded wafer level ball grid array (eWLB) 178. FIG. 5 shows eWLB 178 after singulation. Semiconductor die 124 is electrically connected through bumps 154, conductive layer 150, and conductive vias 148 to build up interconnect structure 168. The interposer 156 with conductive vias 148, conductive layer 150, insulating layer 152, and bumps 154 provide a simple and cost effective structure for vertical interconnect of semiconductor die 124, as well as efficient package stacking through the conductive layers of the interposer and build-up interconnect structure 168. Since interposer 156 can be made with similar material as semiconductor die 124 and build-up interconnect structure 168 is formed over a surface of the interposer opposite the semiconductor die and encapsulant 164, the interposer negates CTE mismatch between the semiconductor die and build-up interconnect structure. The interposer 156 operates as a buffer between semiconductor die 124 on one side of the interposer and build-up interconnect structure 168 on an opposite side of the interposer to reduce warpage. The interposer 156 provides fine pitch vertical interconnect for semiconductor die 124 suitable for high I/O count applications.

Figure 6:
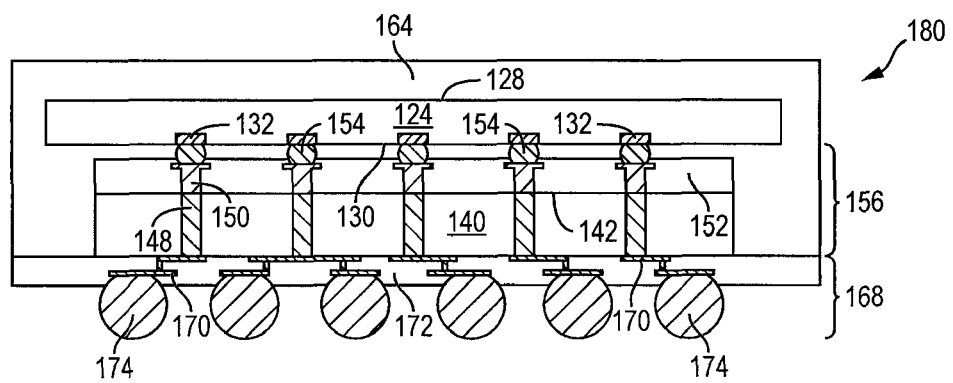
FIG. 6 illustrates the semiconductor die having a larger footprint than the TSV interposer.

FIG. 6 shows an embodiment of eWLB 180, similar to FIG. 5, with semiconductor die 124 having a footprint larger than interposer 156. Semiconductor die 124 extends over the outside dimensions of interposer 156. Encapsulant 164 extends down a side surface of interposer 156.

Figure 7:
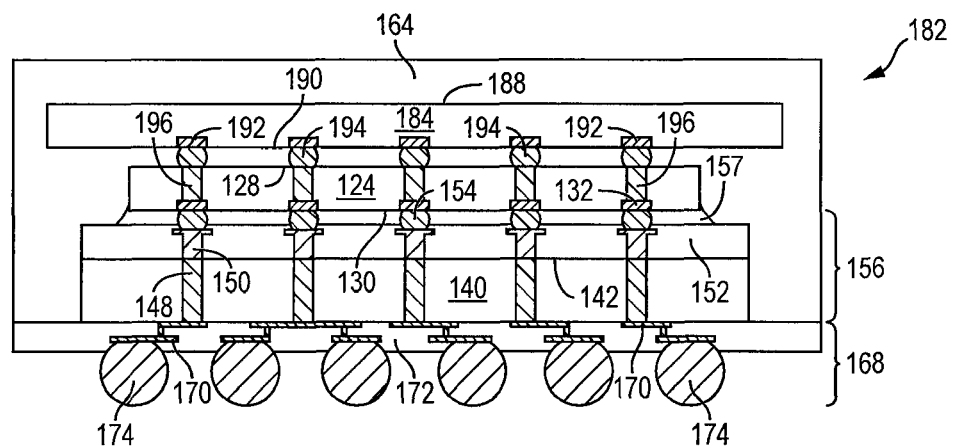
FIG. 7 illustrates two stacked semiconductor die mounted to the TSV interposer with the upper die having a larger footprint than the TSV interposer.

FIG. 7 shows an embodiment of eWLB 182, similar to FIG. 5, with semiconductor die 184 mounted to semiconductor die 124. Semiconductor die 184 originates from a semiconductor wafer, similar to FIGS. 3a-3c, with a footprint larger than semiconductor die 124 and interposer 156. Semiconductor die 184 has a back surface 188 and active surface 190 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 190 to implement analog circuits or digital circuits, such as DSP, ASIC, memory, or other signal processing circuit. Semiconductor die 184 may also contain IPDs, such as inductors, capacitors, and resistors, for RF signal processing. A plurality of contact pads 192 is formed over active surface 190 and electrically connected to the circuits on the active surface. A plurality of bumps 194 is formed over contact pads 192. In one embodiment, semiconductor die 184 is a flipchip type semiconductor die.

A plurality of conductive vias 196 is formed through semiconductor die 124, typically at the wafer level in FIGS. 3a-3b, for z-direction vertical interconnect. Semiconductor die 184 is mounted to semiconductor die 124 with bumps 194 metallurgically and electrically connected to conductive vias 196. In one embodiment, semiconductor die 124 is a logic device or DSP and semiconductor die 184 is a memory device. Semiconductor die 184 extends over the outside dimensions of semiconductor die 124 and interposer 156. Encapsulant 164 extends down a side surface of interposer 156.

Figure 8:
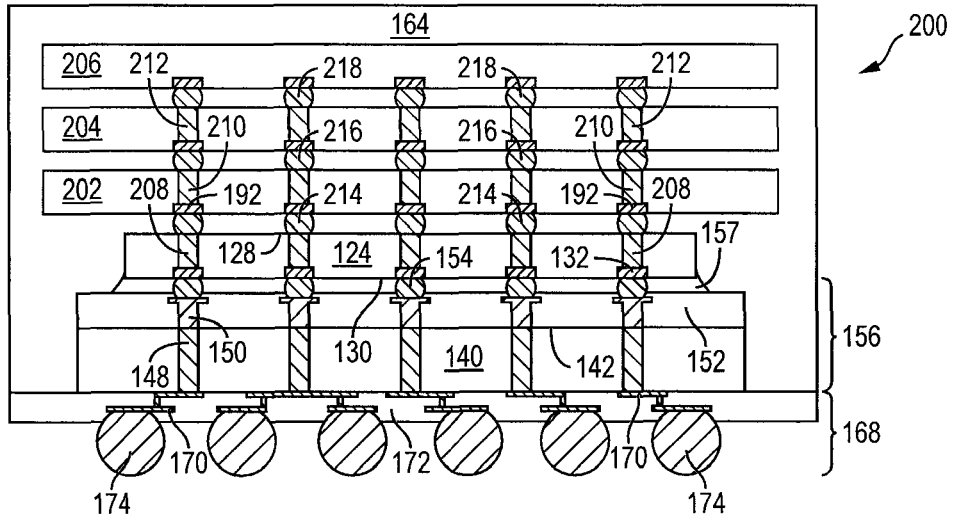
FIG. 8 illustrates four stacked semiconductor die mounted to the TSV interposer with the upper die having a larger footprint than the TSV interposer.

FIG. 8 shows an embodiment of eWLB 200, similar to FIG. 5, with semiconductor die 202, 204, and 206 stacked over semiconductor die 124. Semiconductor die 202-206 originate from a semiconductor wafer, similar to FIGS. 3a-3c, with a footprint larger than semiconductor die 124 and interposer 156. Each semiconductor die 202-206 has a back surface and active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 202-206 may also contain IPDs, such as inductors, capacitors, and resistors, for RF signal processing. A plurality of contact pads is formed over the active surface and electrically connected to the circuits on the active surface. A plurality of bumps is formed over the contact pads for semiconductor die 202-206. In one embodiment, semiconductor die 202-206 are flipchip type semiconductor die.

A plurality of conductive vias 208 is formed through semiconductor die 124, typically at the wafer level in FIGS. 3*a*-3*b*, for z-direction vertical interconnect. Likewise, a plurality of conductive vias 210 is formed through semiconductor die 202, and a plurality of conductive vias 212 is formed through semiconductor die 204 for z-direction vertical interconnect. Semiconductor die 202 is mounted to semiconductor die 124 with bumps 214 metallurgically and electrically connected to conductive vias 208. Semiconductor die 204 is mounted to semiconductor die 202 with bumps 216 metallurgically and electrically connected to conductive vias 210. Semiconductor die 206 is mounted to semiconductor die 204 with bumps 218 metallurgically and electrically connected to conductive vias 212. In one embodiment, semiconductor die 124 is a logic device or DSP and semiconductor die 202-206 are memory devices. Semiconductor die 202-206 extend over the outside dimensions of semiconductor die 124 and interposer 156. Encapsulant 164 extends down a side surface of interposer 156.

Figure 9:
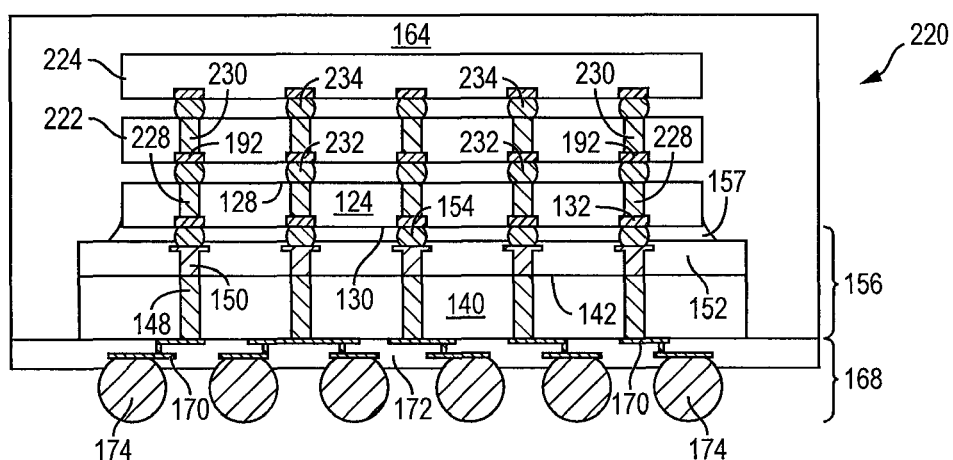
FIG. 9 illustrates three stacked semiconductor die mounted to the TSV interposer with the encapsulant extending down to the interposer.

FIG. 9 shows an embodiment of eWLB 220, similar to FIG. 5, with semiconductor die 222 and 224 stacked over semiconductor die 124. Semiconductor die 222 and 224 originate from a semiconductor wafer, similar to FIGS. 3*a*-3*c*. Each semiconductor die 222-224 has a back surface and active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 222-224 may also contain IPDs, such as inductors, capacitors, and resistors, for RF signal processing. A plurality of contact pads is formed over the active surface and electrically connected to the circuits on the active surface. A plurality of bumps is formed over the contact pads for semiconductor die 222-224. In one embodiment, semiconductor die 222-224 are flipchip type semiconductor die.

A plurality of conductive vias 228 is formed through semiconductor die 124, typically at the wafer level in FIGS. 3*a*-3*b*, for z-direction vertical interconnect. Likewise, a plurality of conductive vias 230 is formed through semiconductor die 222 for z-direction vertical interconnect. Semiconductor die 222 is mounted to semiconductor die 124 with bumps 232 metallurgically and electrically connected to conductive vias 228. Semiconductor die 224 is mounted to semiconductor die 222 with bumps 234 metallurgically and electrically connected to conductive vias 230. In one embodiment, semiconductor die 124 is a logic device or DSP and semiconductor die 222-224 are memory devices. In this embodiment, encapsulant 164 extends down a side surface of interposer 156.

Figure 10:
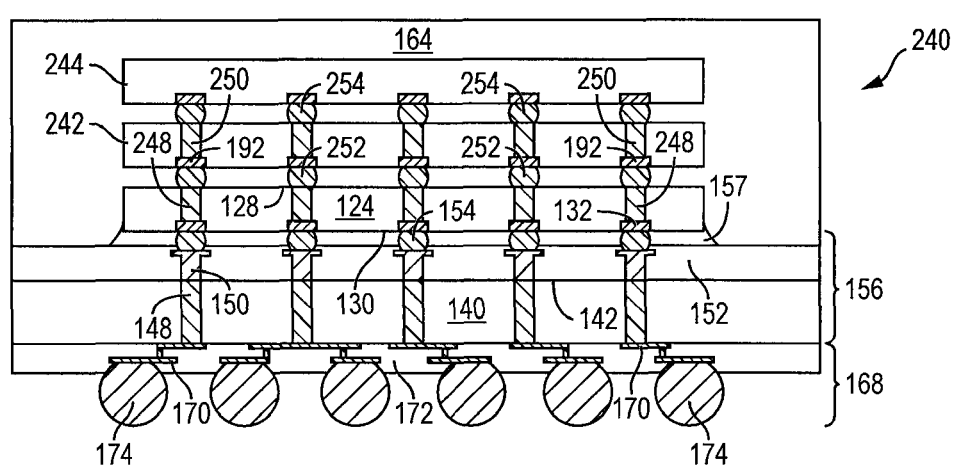
FIG. 10 illustrates three stacked semiconductor die mounted to the TSV interposer with the encapsulant extending down along side surfaces of the interposer.

FIG. 10 shows an embodiment of eWLB 240, similar to FIG. 5, with semiconductor die 242 and 244 stacked over semiconductor die 124. Semiconductor die 242 and 244 originate from a semiconductor wafer, similar to FIGS. 3*a*-3*c*. Each semiconductor die 242-244 has a back surface and active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 242-244 may also contain IPDs, such as inductors, capacitors, and resistors, for RF signal processing. A plurality of contact pads is formed over the active surface and electrically connected to the circuits on the active surface. A plurality of bumps is formed over the contact pads for semiconductor die 242-244. In one embodiment, semiconductor die 242-244 are flipchip type semiconductor die.

A plurality of conductive vias 248 is formed through semiconductor die 124, typically at the wafer level in FIGS. 3*a*-3*b*, for z-direction vertical interconnect. Likewise, a plurality of conductive vias 250 is formed through semiconductor die 242 for z-direction vertical interconnect. Semiconductor die 242 is mounted to semiconductor die 124 with bumps 252 metallurgically and electrically connected to conductive vias 248. Semiconductor die 244 is mounted to semiconductor die 242 with bumps 254 metallurgically and electrically connected to conductive vias 250. In one embodiment, semiconductor die 124 is a logic device or DSP and semiconductor die 242-244 are memory devices. In this embodiment, a side of interposer 156 is exposed from eWLB 240.

Figure 11:
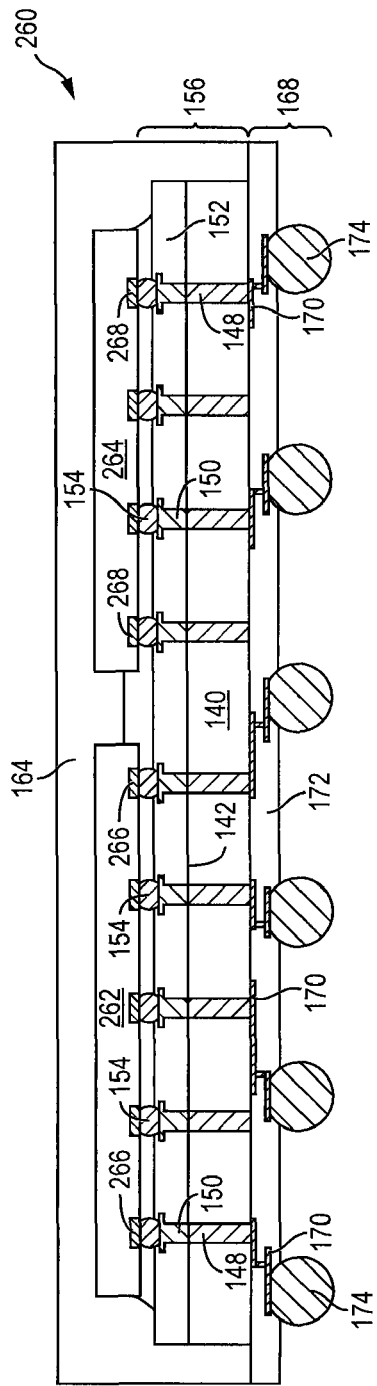
FIG. 11 illustrates two semiconductor die mounted side-by-side to the TSV interposer.

FIG. 11 shows an embodiment of eWLB 260, similar to FIG. 5, with semiconductor die 262 and 264 mounted side-by-side to interposer 156. Semiconductor die 262 and 264 originate from a semiconductor wafer, similar to FIGS. 3*a*-3*c*. Each semiconductor die 262-264 has a back surface and active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 262-264 may also contain IPDs, such as inductors, capacitors, and resistors, for RF signal processing. A plurality of contact pads 266 is formed over the active surface of semiconductor die 262 and electrically connected to the circuits on the active surface. A plurality of contact pads 268 is formed over the active surface of semiconductor die 264 and electrically connected to the circuits on the active surface. In one embodiment, semiconductor die 262-264 are flipchip type semiconductor die.

Semiconductor die 262 is mounted to interposer 156 with contact pads 266 metallurgically and electrically connected to bumps 154. Semiconductor die 264 is mounted to interposer 156, adjacent to semiconductor die 262, with contact pads 268 metallurgically and electrically connected to bumps 154. Encapsulant 164 extends down a side surface of interposer 156.

Figure 12:
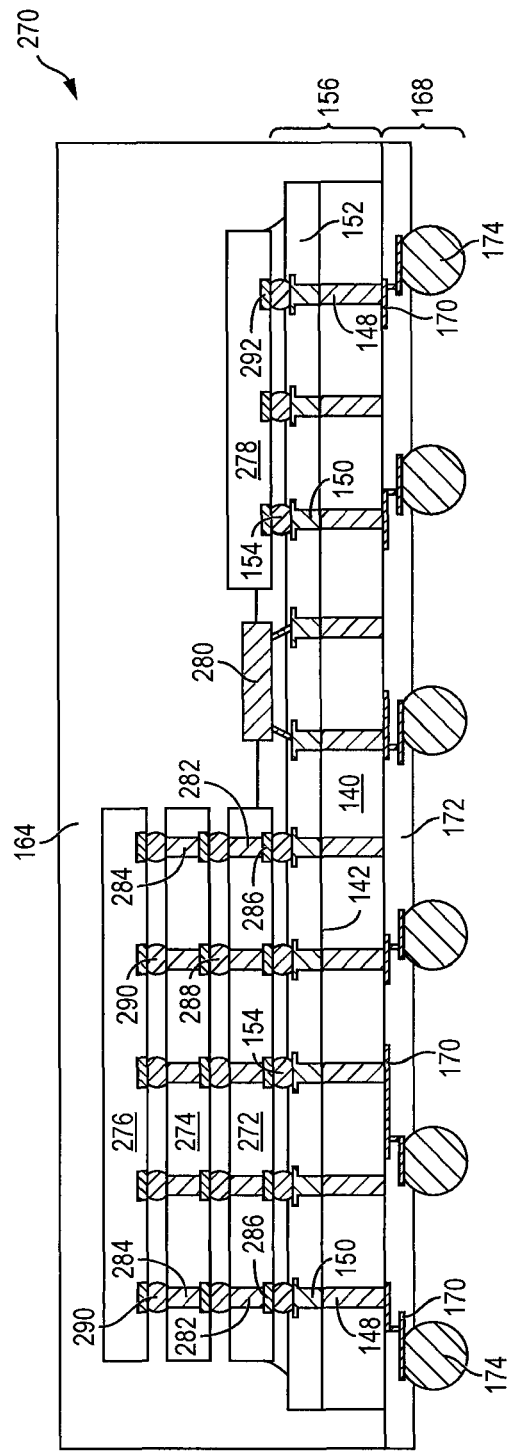
FIG. 12 illustrates three stacked semiconductor die and one side-by-side semiconductor die mounted to the TSV interposer.

FIG. 12 shows an embodiment of eWLB 270, similar to FIG. 5, with semiconductor die 272, 274, and 276 stacked over interposer 156. In addition, semiconductor die 278 is mounted side-by-side with respect to semiconductor die 272 on interposer 156, and discrete semiconductor device 280 is mounted to conductive layer 150 of interposer 156. Discrete semiconductor device 280 can be an active device, such as a transistor or diode, or a passive device, such as an inductor, capacitor, or resistor.

Semiconductor die 272-278 originate from a semiconductor wafer, similar to FIGS. 3a-3c. Each semiconductor die 272-278 has a back surface and active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 272-278 may also contain IPDs, such as inductors, capacitors, and resistors, for RF signal processing. A plurality of contact pads is formed over the active surface and electrically connected to the circuits on the active surface. A plurality of bumps is formed over the contact pads for semiconductor die 274 and 276. In one embodiment, semiconductor die 272-278 are flipchip type semiconductor die.

A plurality of conductive vias 282 is formed through semiconductor die 272, typically at the wafer level, for z-direction vertical interconnect. Likewise, a plurality of conductive vias 284 is formed through semiconductor die 274 for z-direction vertical interconnect. Semiconductor die 272 is mounted to interposer 156 with contact pads 286 metallurgically and electrically connected to bumps 154. Semiconductor die 274 is mounted to semiconductor die 272 with bumps 288 metallurgically and electrically connected to conductive vias 282. Semiconductor die 276 is mounted to semiconductor die 274 with bumps 290 metallurgically and electrically connected to conductive vias 284. Semiconductor die 278 is mounted to interposer 156 with contact pads 292 metallurgically and electrically connected to bumps 154. In one embodiment, semiconductor die 272 and 278 are logic devices or DSP and semiconductor die 274-276 are memory devices.

Figure 13A:
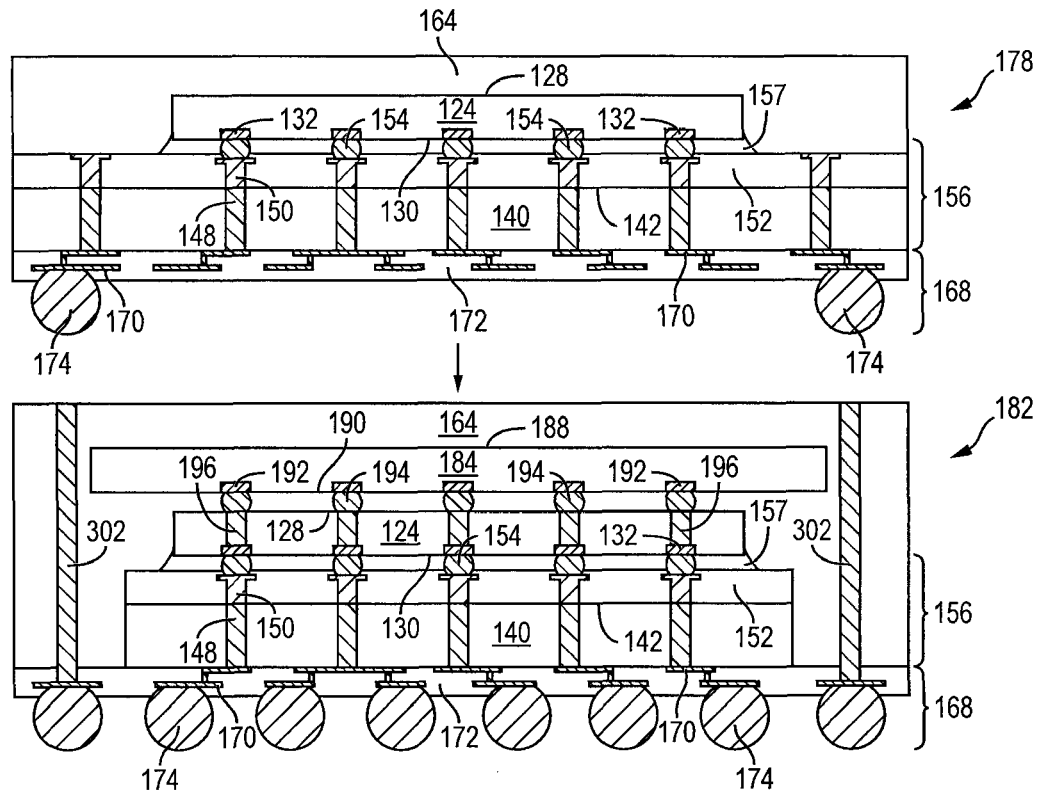
FIGS. 13a-13b illustrate a PoP arrangement with semiconductor die mounted to the TSV interposer.
Figure 13B:
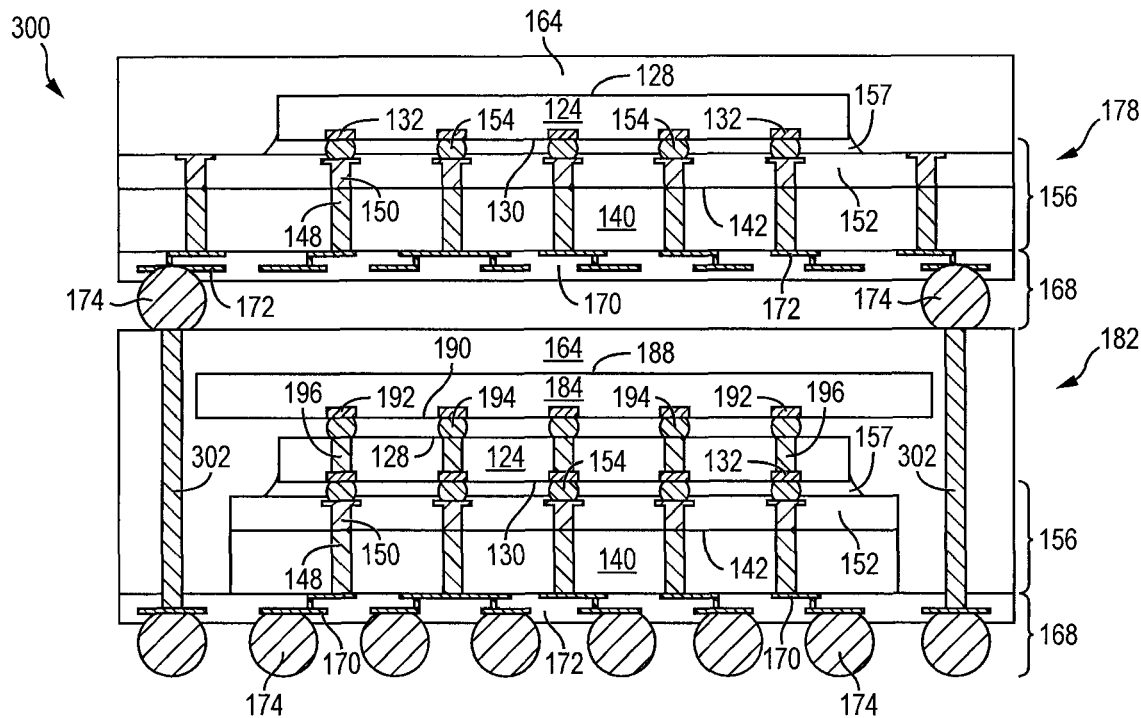

FIGS. 13a-13b show an embodiment of package-on-package (PoP) arrangement 300 with eWLB 178 from FIG. 5 stacked over eWLB 182 from FIG. 7. In FIG. 13a, eWLB 178 is positioned over eWLB 182. A plurality of conductive vias 302 is formed through encapsulant 164 of eWLB 182. FIG. 13b shows eWLB 178 mounted to eWLB 182 with bumps 174 of eWLB 178 metallurgically and electrically connected to conductive vias 302.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including first and second opposing surfaces;
   forming a plurality of vias partially through the first surface of the substrate;
   completely filling the plurality of vias with a conductive material to form a plurality of conductive vias;
   forming a conductive layer over the first surface of the substrate electrically connected to the conductive vias;
   disposing an insulating layer around the conductive layer to completely cover side surfaces of the conductive layer;
   disposing a first semiconductor die over the first surface of the substrate electrically connected to the conductive layer;
   depositing an encapsulant over the first semiconductor die and substrate including a side surface of the substrate;
   removing a portion of the second surface of the substrate to expose the conductive vias coplanar with the second surface of the substrate after disposing the first semiconductor die over the substrate;
   forming a redistribution layer over the encapsulant and substrate opposite the first semiconductor die and electrically connected to the first semiconductor die; and
   forming a conductive via through the encapsulant and electrically connected to the redistribution layer.

2. The method of claim 1, further including:
   forming the insulating layer prior to disposing the first semiconductor die over the first surface of the substrate; and
   forming a plurality of bumps over the conductive layer.

3. The method of claim 1, further including depositing an underfill material beneath the first semiconductor die.

4. The method of claim 1, further including disposing a second semiconductor die over the first semiconductor die.

5. The method of claim 1, further including disposing a plurality of second semiconductor die over the first semiconductor die.

6. The method of claim 1, further including disposing a second semiconductor die over the first surface of the substrate adjacent to the first semiconductor die.

7. The method of claim 1, further including forming an interconnect structure over the second surface of the substrate.

8. A method of making a semiconductor device, comprising:
   providing a substrate;
   forming a first conductive via within the substrate;
   forming a conductive layer, including a redistribution layer and a second conductive via, over the first conductive via;
   forming an insulating layer over the substrate after forming the redistribution layer and second conductive via;
   disposing a first semiconductor die over the substrate;
   disposing an encapsulant over the semiconductor die and substrate including a side surface of the substrate;
   removing a portion of the substrate to expose the first conductive via; and
   forming a build-up interconnect structure over the exposed first conductive via, encapsulant, and first semiconductor die.

9. The method of claim 8, further including forming the first conductive via partially through a first surface of the substrate.

10. The method of claim 8, further including forming an interconnect structure over the substrate opposite the first semiconductor die.

11. The method of claim 8, further including disposing a second semiconductor die over the first semiconductor die.

12. The method of claim 8, further including forming a third conductive via through the first semiconductor die.

13. The method of claim 8, further including disposing a second semiconductor die including a memory circuit over the first semiconductor die.

14. The method of claim 8, further including disposing a second semiconductor die over a first surface of the substrate adjacent to the first semiconductor die.

* * * * *